(12) United States Patent
Simmons et al.

(10) Patent No.: US 8,385,947 B2
(45) Date of Patent: Feb. 26, 2013

(54) SYSTEM AND METHOD FOR COMMUNICATING USING AN IN-VEHICLE SYSTEM

(75) Inventors: Sean Simmons, Waterloo (CA); Stefan E. Janhunen, Waterloo (CA); David S. Furbeck, Irving, TX (US)

(73) Assignee: Research In Motion Limited, Waterloo, Ontario (CA)

( * ) Notice: Subject to any disclaimer, the term of this patent is extended or adjusted under 35 U.S.C. 154(b) by 724 days.

(21) Appl. No.: 12/538,742

(22) Filed: Aug. 10, 2009

(65) Prior Publication Data

US 2010/0067439 A1 Mar. 18, 2010

Related U.S. Application Data

(60) Provisional application No. 61/087,997, filed on Aug. 11, 2008.

(51) Int. Cl.
*H04W 24/00* (2009.01)

(52) U.S. Cl. ............... 455/456.6; 455/435.2; 455/552.1; 370/338

(58) Field of Classification Search ............... 455/426.1, 455/435.1, 435.2, 456.1–456.6, 552.1; 370/338
See application file for complete search history.

(56) References Cited

U.S. PATENT DOCUMENTS

| | | | |
|---|---|---|---|
| 2004/0028020 A1* | 2/2004 | Frederiksen et al. | 370/342 |
| 2006/0291395 A1* | 12/2006 | Ketonen et al. | 370/236 |
| 2007/0260957 A1 | 11/2007 | Soljanin et al. | |

FOREIGN PATENT DOCUMENTS

| | | |
|---|---|---|
| EP | 0 905 948 A2 | 3/1999 |
| EP | 1 962 450 A1 | 8/2008 |
| WO | 2007069406 A1 | 6/2007 |
| WO | 2008073093 A1 | 6/2008 |

OTHER PUBLICATIONS

International Search Report and Written Opinion under date of mailing Dec. 28, 2009 in connection with International Patent Application PCT/US2009/053455.
Anonymous: "Luby Transform Code," Wikipedia, The Free Encyclopedia, May 14, 2007, XP002558776.
Mackay D J C: "Fountain Codes Capacity Approaching Codes Design and Implementation," IEE Proceedings: Communications, vol. 152, No. 6, Dec. 9, 2005, pp. 1062-1068, XP006025749.

* cited by examiner

*Primary Examiner* — Nhan Le
(74) *Attorney, Agent, or Firm* — Quarles & Brady LLP

(57) ABSTRACT

A system and method for communicating wirelessly from a mobile device to a remote receiver station is disclosed. The system includes a controller configured to monitor a status of the mobile device and, upon an initiation event, initiate a data transfer process to wirelessly communicate data to the remote receiver station. The system also includes a voice-band modem that, upon initiation of the data transfer process. The voice-band modem is configured to receive data for transfer to the remote receiver station, encode the data to form a series of encoded packets, and transmit the encoded packets to the remote receiver station using a first modulation scheme. Thereafter, unless an indication that the series of packets has been received by at the receiving station is provided, the voice-band modem automatically retransmit the encoded packets to the remote receiver station using a second modulation scheme.

6 Claims, 7 Drawing Sheets

SYSTEM AND METHOD FOR COMMUNICATING USING AN IN-VEHICLE SYSTEM

CROSS-REFERENCE TO RELATED APPLICATIONS

This application is based on, incorporates herein by reference, and claims the benefit of U.S. Provisional Application Ser. No. 61/087,997, filed on Aug. 11, 2008, and entitled, "SYSTEM AND METHOD COMMUNICATING USING AN IN-VEHICLE SYSTEM."

FIELD OF THE INVENTION

This invention relates generally to systems and methods for data communication and, more particularly, to a system and method for enabling optimal transmission of data from one device to another by using a trigger signal that includes a pattern of modulation schemes that can be used by the receiving device to determine which scheme to use to transmit information to the other device.

BACKGROUND OF THE INVENTION

Increasingly, vehicles (e.g., automobiles, trucks, boats, and the like) include integrated communications systems and/or systems for communicating with or controlling non-integrated communications systems. For example, many vehicles include systems to access and communicate via cellular or satellite communications. Additionally or alternatively, many vehicles include local area communications systems, such as Bluetooth communications devices, that are capable of accessing cellular, wireless local area networks (WLANs) or satellite communications devices. Bluetooth is a registered trademark of Bluetooth SIG, Inc., of Delaware.

These communications systems are typically designed to be controlled by a user to facilitate voice communications using external communication networks. Hence, the modems included within these vehicle-integrated systems are typically "voice" modems. Voice modems are relatively "slower" modems when compared with data-specific modems for several reasons. First, the relative amount of data required to facilitate voice communications is significantly less than required for contemporary data communications. Second, voice modem signals have to go through a speech encoding/decoding process which requires some time to perform.

While these systems are specifically used for transmitting voice signals, in many applications it is desirable to utilize these vehicle-integrated communications systems to communicate a wider variety of data. This data may include information about an associated vehicle (e.g., make, model, year, color, maintenance record, and the like), information about the passengers or cargo in the vehicle, (e.g., name, medical history, age, gender, and the like) information related to an emergency condition associated with the vehicle, and other information.

It would be desirable to have a system and method for communicating data using communications systems that are integrated within vehicles where the system is highly robust, yet capable of communicating the data very rapidly.

BRIEF DESCRIPTION OF THE DRAWINGS

The invention will hereafter be described with reference to the accompanying drawings, wherein like reference numerals denote like elements, and.

DETAILED DESCRIPTION OF THE INVENTION

In accordance with one aspect of the disclosure, a system for communicating wirelessly from a mobile device to a remote receiver station is provided. The system includes a controller configured to monitor a status of the mobile device and, upon an initiation event, initiate a data transfer process to wirelessly communicate data to the remote receiver station. The system also includes a voice-band modem that, upon initiation of the data transfer process, is configured to communicate with the controller to receive source data for transfer to the remote receiver station, encode the source data to form a series of encoded packets, and transmit the encoded packets to the remote receiver station using a first modulation scheme. Unless an indication is provided that the series of packets has been received by the receiving station, the controller automatically retransmits the encoded packets to the remote receiver station using a second modulation scheme.

In accordance with another aspect of the disclosure, a system for communicating wirelessly from a mobile device to a remote receiver station is provided. The system includes an answering point device configured to receive a data transfer from the mobile device and including a controller. The controller is configured to receive a series of encoded packets from the mobile device using a first modulation scheme, perform a Fourier transform on the series of encoded packets at each of a plurality of frequencies, and sort transformed encoded packets into a corresponding plurality of bins by magnitude. The controller is also configured to identify a predetermined number of bins having a largest frequency magnitude and analyze the predetermined number of bins to determine the source data included in the series of encoded packets therefrom.

In accordance with still another aspect of the disclosure, a method for communicating wirelessly from a mobile device to a remote receiver station is provided The method includes assembling source data for transfer to the remote receiver station and encoding the source data to form a series of encoded packets. Upon receiving a trigger signal from the remote receiver station, the encoded packets are transmitted to the remote receiver station using a first modulation scheme and, if the trigger signal persists, the encoded packets are automatically retransmitted to the remote receiver station using a second modulation scheme.

Figure 1:
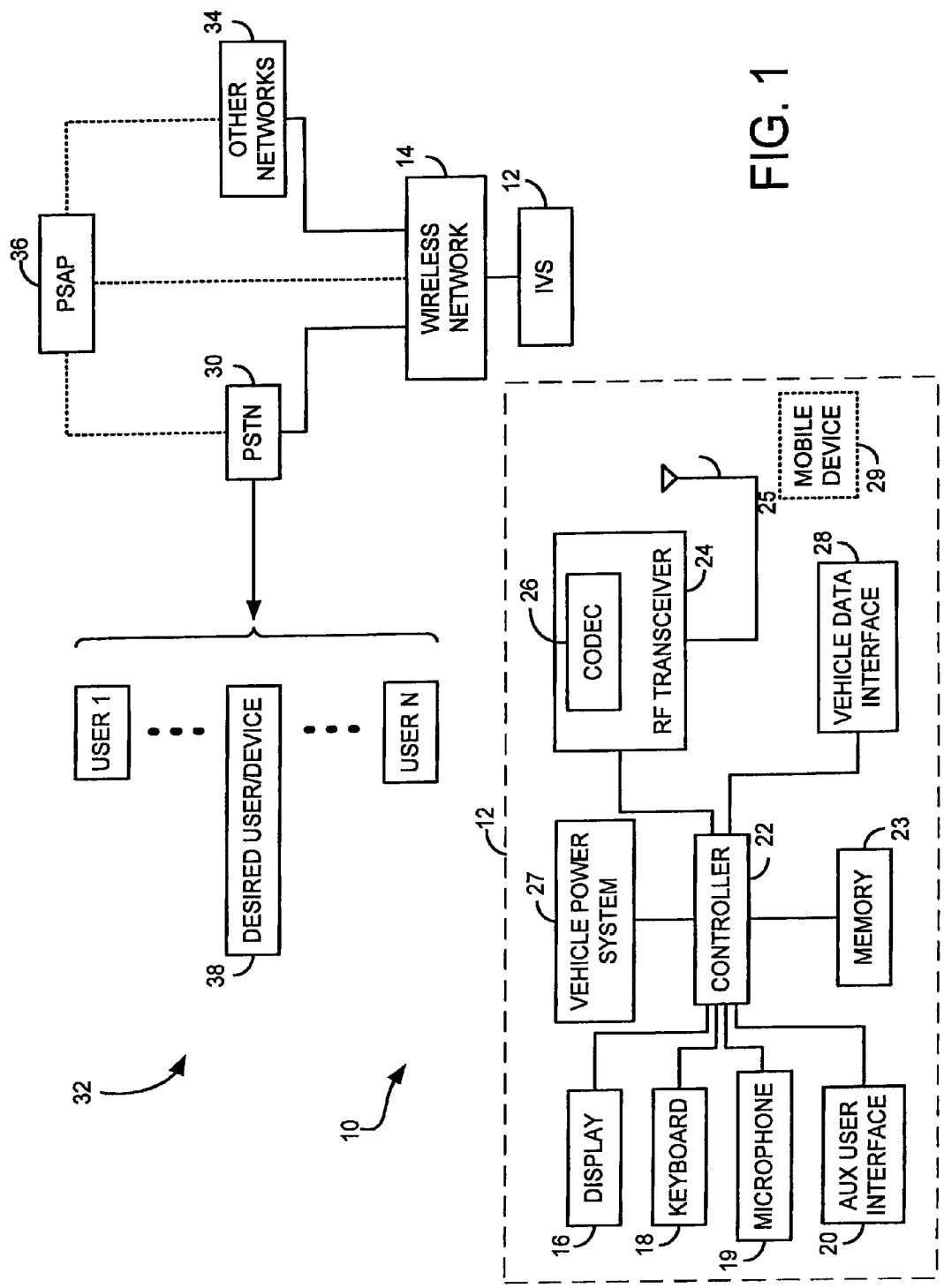
FIG. 1 is a block diagram of a communications system illustrating some common components of a vehicle-integrated communication device that is designed to communicate within a wireless communication network.

Referring to FIG. 1, a communications system 10 includes a mobile electronic device such as an in-vehicle system (IVS) 12 as a first device, a wireless network and related networking components 14, 30, 34, and the like, desired or target user devices 32, and a Public Safety Answering Point (PSAP) 36 wherein the PSAP is associated with or includes a second device referred to at times hereafter as an answering point device. The IVS 12 is configured to communicate through the wireless communication network 14 and other en route networks (e.g., a landline network) to desired user devices and/or the PSAP 36. Typically, any communication with the desired user devices or PSAP 36 must pass through the PSTN 30. The wireless network may employ any protocol, such as Code Division Multiple Access (CDMA), Global System for Mobile communications (GSM), and the like and may be of any generation.

The exemplary IVS 12 includes a number of user interfaces including a visual display 16, a virtual or dedicated keyboard 18, a microphone 19, and one or more auxiliary user interfaces 20. The IVS 12 further includes a controller 22 (e.g., a processor), a memory 23, a radio frequency (RF) transceiver 24 including a voice codec (i.e., a COder-DECoder device capable of encoding and/or decoding a digital data signal) 26, a vehicle power system 27, a vehicle data interface 28, an antenna 25 and, in some cases, a mobile device 29 (e.g., a separate cellular phone or the like). Each of the user interface devices 16, 18, 19, 20 is coupled to the controller 22. The controller 22 is also linked to the memory 23, vehicle power system 17, RF transceiver 24, and data interface 28. The controller 22 is designed to communicate through the radio frequency (RF) transceiver circuitry 24 and antenna 25. The codec 26, in most configurations, is a voice-band codec used for encoding and transmitting speech. The controller 22 and other components described above receive power from the vehicle power systems 27. The controller 22 is in communication with the vehicle data interface 28, which provides access to a wide variety of data gathered by and/or stored by the IVS 12.

It is contemplated that the memory 23 may include a Subscriber Identity Module (SIM) or a Removable User Identity Module (R-UIM) that is connected to or receivable within, for example, one of the auxiliary user interfaces 20. As an alternative to a SIM or an R-UIM, the IVS 12 may operate based on configuration data programmed by a service provider into the memory 23.

It is contemplated that the RF transceiver circuitry 24 and antenna 25 may be designed for short-range RF communication, such as using a Bluetooth communications protocol, and/or, as illustrated, may be designed for longer-range RF communications, such as cellular networks and the like. Specifically, the controller 22, RF transceiver 24, and antenna 25 may be designed to communicate directly with the wireless communications network 14. Alternatively, the IVS 12 may not be capable of directly communicating with the wireless network 14 and, in this case, the controller 22, RF transceiver 24, and antenna 25 may communicate with the wireless network 14 through another device, such as mobile wireless device 29. For purposes of brevity, FIG. 1 will be described with respect to the IVS 12 having the ability to communicate with the wireless network 14 directly.

Referring still to FIG. 1, the wireless network 14 may be in communication with a variety of entities and communication mediums. For example, the wireless network 14 is in communication with a Public Switched Telephone Network (PSTN) 30 connecting to a variety of end users 32 and other public or private networks 34, including the internet. As will be described, the wireless network 14 is configured to provide access to at least one PSAP 36. As illustrated, this access may be facilitated by the PSTN or other networks 34 or may be provided through direct communication between the wireless network 14 and the PSAP 36.

In operation, a user selects desired operations, such as voice communication, via the display 16, keyboard 18, and/or any auxiliary user interfaces 20. The controller 22 receives the user selections and initiates, for example, voice communications. The wireless network 14 provides a connection to a desired phone number through the PSTN 30 and communicates back to the IVS 12 to attempt a connection between the user of the vehicle and a user/device 38 associated with a desired phone number. If a connection can be established, audio of the user's voice is received by the microphone 19, provided to the controller 22, encoded by the RF transceiver circuitry 24 and, in particular, the voice codec 26, and transmitted to the wireless network 14 via antenna 25. The wireless network 14 receives the encoded voice information, decodes the voice information, and formats the voice information to be communicated by the PSTN 30 to the desired user/device 38.

Such voice operation is common using the above-described systems. One category of such voice communications includes voice communications between drivers or passengers in the IVS 12 and public or private service entities, safety entities, security entities, and the like. These communications may utilize the PSTN 30 in the manner described above or may be made directly to a PSAP 36. Such communications may be for non-emergency purposes, such as requesting directions, or may be for emergency purposes, such as in the case of an accident. While voice communications to emergency personnel are as readily available to the user as communications to others in the manner described above, data transmission over the above-described systems can be more difficult, which is particularly problematic when communicating with personnel in an emergency situation.

In particular, a number of factors contribute to difficulties in processing data transmission quickly and reliably using the above-described system. One significant factor is the fact that, as described above, the RF transceiver circuitry 24 includes a voice codec 26. While the voice codec 26 works very well for the communication of human speech, it is not optimized for data transmission. Accordingly, protocols such as the cellular text telephone modem (CTM) protocol have been developed.

The CTM protocol uses a series of tones to transmit data. CTM was originally developed to provide a voice-band modem protocol designed to facilitate TeleTYpe (TTY) transmission through the voice codecs used in wireless networks. While CTM is very robust, unfortunately, CTM is also very slow when transmitting a significant amount of data. That is, since CTM was designed to facilitate the communication of a small amount of textual data, CTM was designed to trade speed for consistency and cannot transmit a significant amount of data rapidly as would be desirable when communicating with personnel in an emergency situation.

In accordance with the present disclosure, a new communications method is provided that allows the IVS 12 to use the above-described communications systems to automatically communicate data to the PSAP 36 or other entities rapidly and reliably.

Figure 2:
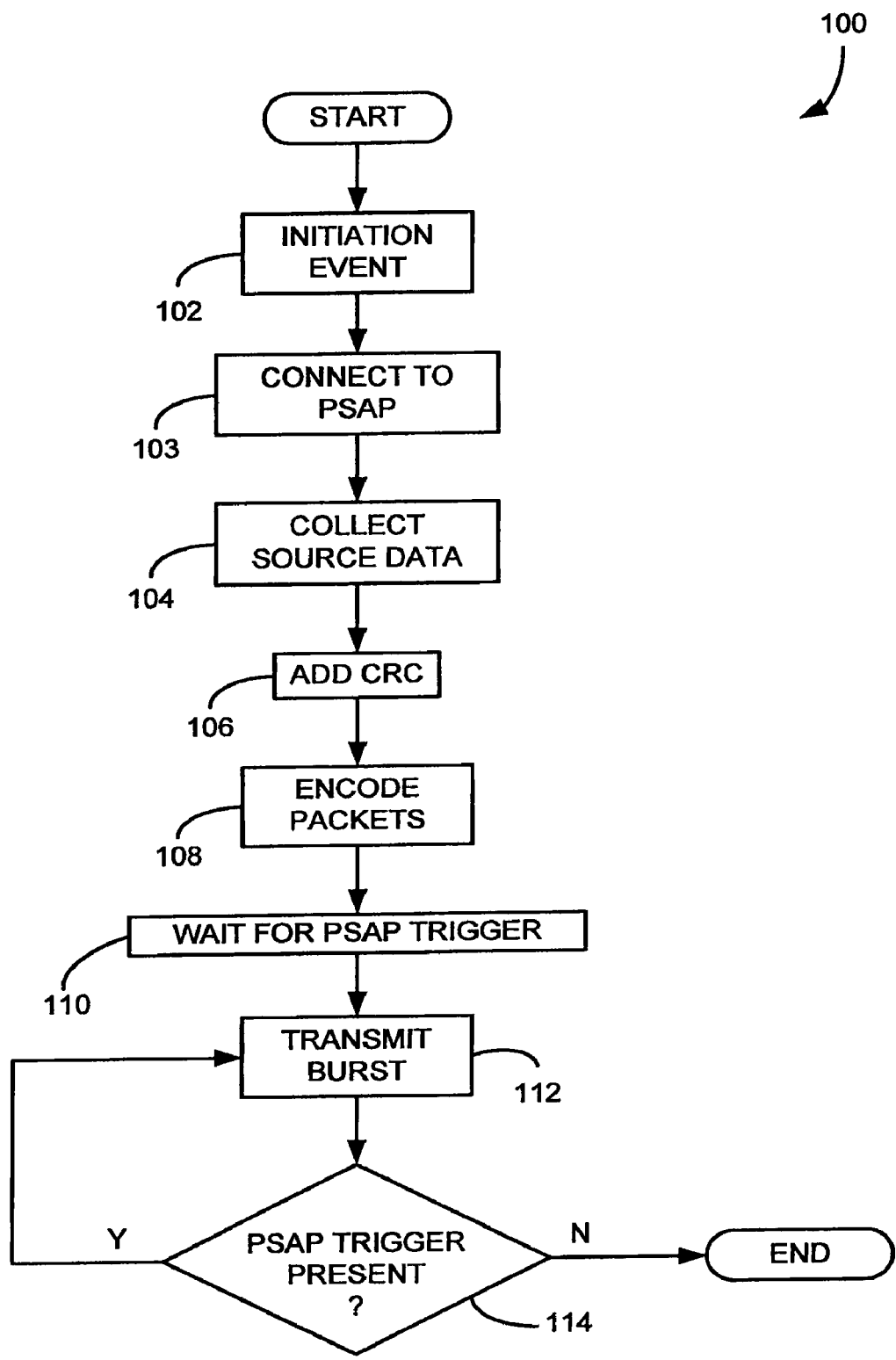
FIG. 2 is a flow chart setting forth the steps of a method of communicating data using the communications system of FIG. 1.

Referring now to FIG. 2, one exemplary process 100 for automatically communicating data to a PSAP begins upon an initiation event at process block 102. For example, the initiation event may be the occurrence of an accident, a vehicle failure, or the like. Upon the occurrence of the initiation event at process block 102, the IVS opens a connection to the PSAP at process block 103. Typically, in the context of FIG. 1, this may involve establishing a call from the IVS to the PSAP. The IVS then collects data for transmission to a PSAP at process block 104. The collected data may include dynamic information, such as the vehicle location at or around the time of the initiation event. Additionally, the collected data may include static information, such as a vehicle identification number (VIN), that can be pre-collected before the initiation event. It is contemplated that the collected data may also include data about the passengers in the vehicle, such as the number of passengers, the positions of passengers within the vehicle, and even medical histories or conditions of passengers that frequently use the vehicle. Similarly, information about cargo in the vehicle and the like may be included. With reference to FIG. 1, it is contemplated that static data may be stored in the memory 23 and dynamic data may be acquired by the controller 22 from the vehicle data interface 28 to provide an emergency data set. This emergency data set will simply be referred to as the source data of the minimum set of data (MSD) in all following discussion.

Referring again to FIG. 2, the source data is collected at process block 104 and a Cyclic Redundancy Code (CRC) (or other form of checksum value) is calculated and added to the source data at process block 106. At block 108 the concatenated source data and CRC is split into smaller data packets (e.g., 18 bit packets) for transmission to the PSAP.

At process block 110, the IVS waits until the PSAP responds with an appropriate trigger signal, which may be, for example, a pre-determined binary pseudorandom sequence. In at least some embodiments this trigger signal persists until the PSAP receiver has correctly decoded the complete source data. Accordingly, as will be described, the present method eliminates the need for the use of an automatic-repeat-request (ARQ) scheme and, thus, does not incur the "round-trip" delays associated with acknowledgement times and the like.

At process block 112, a burst of data, which may be a channel coded realization of one or more of the packets from process block 108 along with a CRC, is transmitted to the PSAP. This process is repeated as long as the PSAP trigger signal is present, as illustrated by decision block 114.

Figure 3:
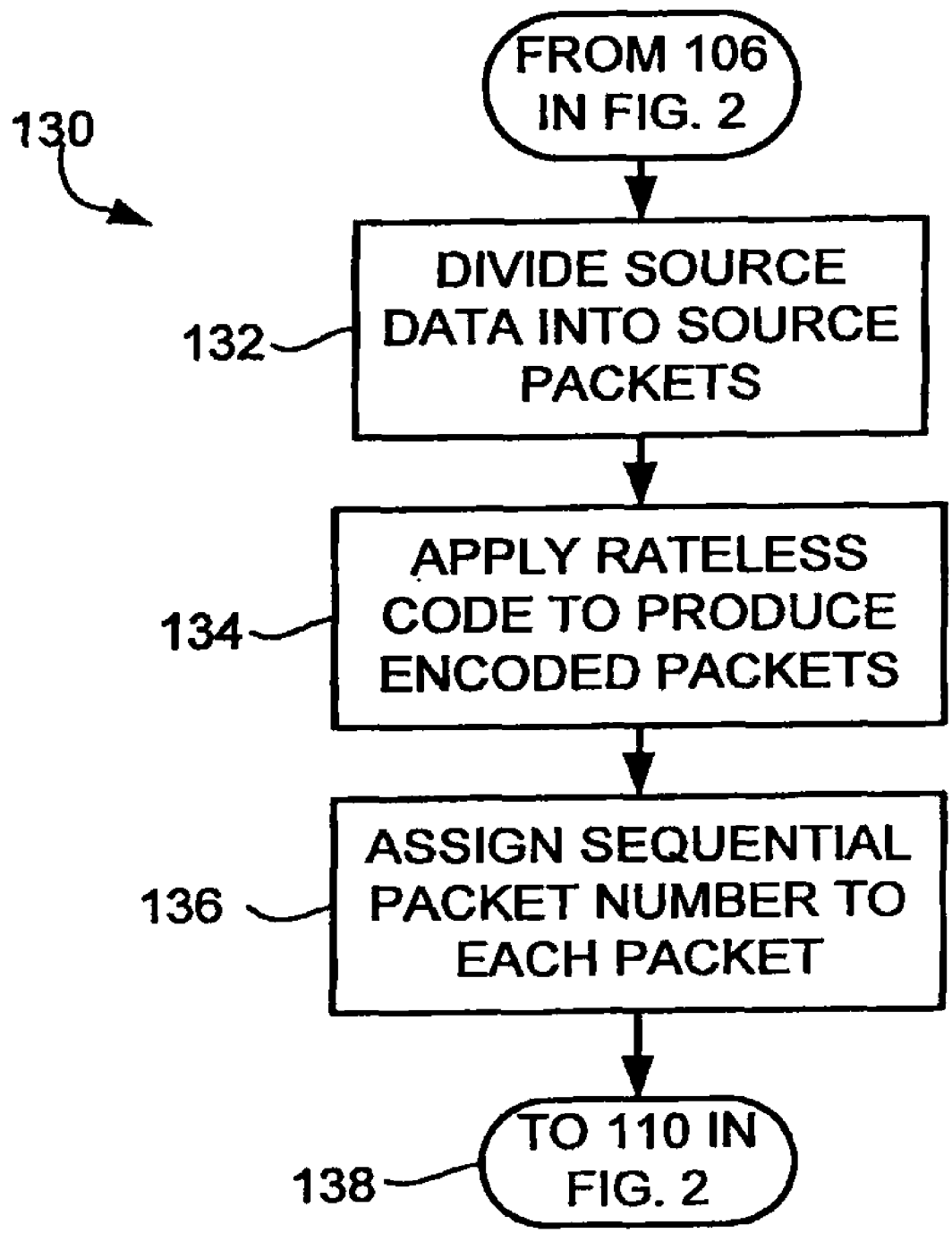
FIG. 3 is a flow chart setting forth the steps of a sub-process of the method illustrated in FIG. 2 for encoding packets.

With respect to the process of encoding the packets, it is contemplated that a linear fountain code may be utilized. Referring to FIG. 3 for a sub-process of FIG. 2 illustrating the generation of encoded packets. In accordance with one configuration, the source data may be formed as 140 bytes of data with a four byte CRC. Hence, the complete source data for transmission may include 1152 bits (i.e., 8 bit times 144 bytes). At process block 132, the complete source data is segmented into source packets. A rateless code is applied at process block 134 to produce a number of encoded packets (typically the number of encoded packets is significantly larger than the number of source packets). In one configuration, the complete 1152 bit data set is segmented into sixty-four 18-bit source packets. These source packets may then be used to produce 3000 18-bit encoded packets (here the number 3000 is exemplary and may represent a limit value). Finally, each encoded packet is numbered sequentially at process block 136. These sequential numbers are not actually present in the encoded packets themselves but are noted for future use.

Fountain codes are often used for pure erasure channels. However, as will be described, the present method does not assume a pure erasure channel. Suppose that K source packets, $p_0, p_1, \ldots p_{k-1}$, are needed to send the complete source data and that each packet is a whole number of bits. When K is relatively small, a random linear fountain code can be efficiently used. A separate column vector or, alternatively, separate row vector containing K randomly generated 1's and 0's is created for each encoded packet $e_n$ that is to be sent. For example, 3000 such vectors would be generated to create 3000 possible encoded packets for transmission.

If the vector for encoded packet n is represented as $G_n$, then an encoded packet, $e_n$, is created according to the following equation:

$$e_n = \left( \sum_{k=0}^{K-1} G_n(k) \cdot p_k \right) \mod 2. \qquad \text{Eqn. (1)}$$

Therefore, the encoded packet is the modulo 2 bitwise sum of the source packets, $p_k$, for which $G_n(k)$ is equal to 1. The receiver (in this case, located in the PSAP) has knowledge of $G_n$ for each n and can decode the transmission by placing a corresponding column vector $G_n$ for each correctly received packet, $e_n$, into a matrix D. The receiver uses the packet number for a given encoded packet to choose the correct $G_n$. When the rank of matrix D becomes equal to the number of packets transmitted K, it is possible to take the inverse of D and recover the source packets $p_0, p_1, \ldots p_{k-1}$.

At times, during transmission some encoded packets will be lost. However, the PSAP receiver can reconstruct the source packets despite lost encoded packets and does not need to communicate back to the IVS to indicate the specific packets that were lost. Even when there are no lost packets, it will usually still be necessary to send a few extra encoded packets in order to recover the original source packets. This is because each $G_n$ is randomly generated and matrix D being invertible after only K encoded packets are received is a random event with probability 0.289.

Accordingly, in at least some configurations, it is contemplated that a modification of the random linear fountain code may be utilized. Specifically, $G_0, G_1, \ldots, G_{k-1}$ may be chosen deterministically so that D is guaranteed to be invertible in the case in which there are no lost packets after only K received packets. The $G_0, G_1, \ldots$ can be chosen in a variety of ways. For example, one possibility is to choose $[G_0, G_1, \ldots, G_{k-1}]$, where $G_n$ are column vectors, as the identity matrix. In this case, when using a clean channel and not incurring any lost packets, an encoded packet $e_n$ corresponding to each source packet $p_k$ will be transmitted as the first K encoded packets and only the same amount of data as in the original K source packets is needed to identify the complete source data.

This method is particularly useful in the system described with respect to FIG. 1, where, due to the slow data rates required for transmission through voice codecs, the time required to send an encoded packet is not insignificant. Frequently, channel conditions will be such that all K packets are received correctly because of the error correction which already exists on the radio channel. Therefore, the above described method can reduce data transmission time significantly over the standard random linear fountain code in good channel conditions.

Once the packets are encoded at process block 108 and the PSAP trigger signal has been detected at process block 110, an adaptive burst transmission protocol is used. The IVS continues transmitting encoded packets in bursts, iterating over successive burst formats, until the PSAP trigger signal is no longer present, indicating the PSAP has successfully received the complete source data. As long as the trigger signal persists, the PSAP has incomplete source data and transmission continues.

A burst format specifies how one or more encoded packets are combined into a single burst and then channel coded for transmission through the voice codec 26 of FIG. 1 and the networks en route to the PSAP. In this context, a channel coding scheme may include application of one or more error detecting code, error correcting code, and/or modulation scheme as necessary.

Figure 4:
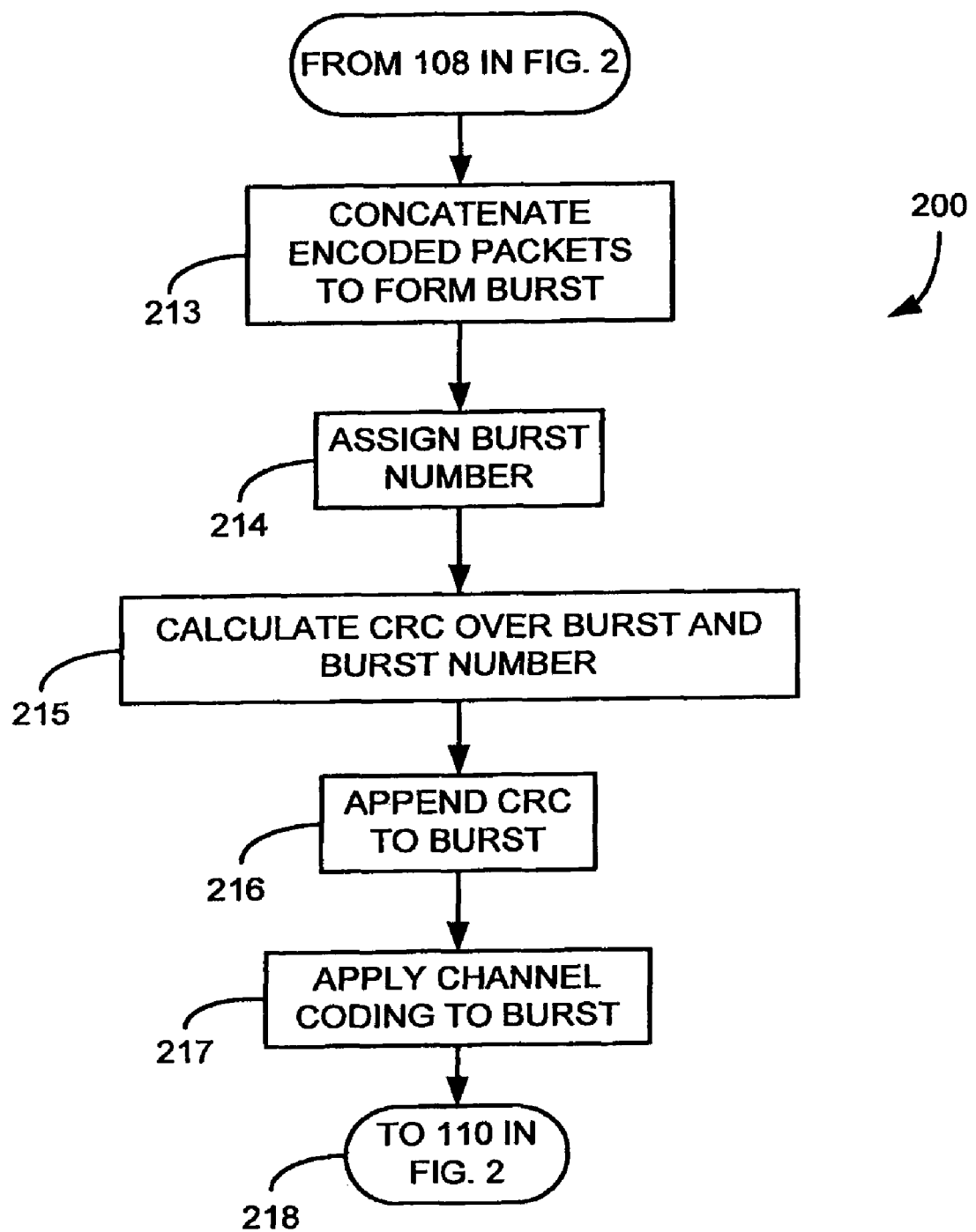
FIG. 4 is a flow chart setting forth the steps of a sub-process of the method illustrated in FIG. 2 for transmitting bursts.

Referring to FIG. 4 for a sub-process of FIG. 2 illustrating one possible burst encoding and transmission process. After block 108 in FIG. 2, control passes to block 213 in FIG. 4 where one or more encoded packets $e_{i_n}, e_{i_n+1}, \ldots e_{i_n+(l_n-1)}$ are concatenated to form an encoded packet set to be associated with a single burst $b_n$, where $i_n$ is the index of the first encoded packet in burst n, and $l_n$ is the number of encoded packets present in burst n. Additionally, a burst number is chosen for $b_n$ at process block 214. This is simply a unique number that identifies which encoded packets are present within the burst. For example, it may be set to the packet number of the first encoded packet $i_n$ present in the burst.

At process block 216, a CRC $c_n$ is generated for burst n by calculating the CRC of the encoded packets combined with the burst number. This CRC is then combined with the encoded packet set to form a burst. However, the burst number is not explicitly transmitted as part of the burst.

Although the receiver in the PSAP has knowledge of all possible vectors $G_n$, it still needs to match each received encoded packet $e_n$ with the appropriate vector $G_n$ so that the matrix D can be constructed correctly. Traditionally, this has been accomplished by transmitting a packet number with each packet or in some type of common packet header if multiple packets are transmitted together. As will be discussed in more detail later, using this approach, it is not necessary to explicitly transmit packet numbers. The packet numbers can be regenerated from the burst number, which can be recovered during CRC verification at the receiver since it was included in the CRC calculation.

At process block 217, a channel coding scheme is applied to the combined burst and CRC to produce the channel coded burst $\hat{b}_n = s_n([b_n c_n])$, where $s_n$ is the channel coding scheme for burst n.

Adaptation is achieved by choosing appropriate $i_n$, $l_n$, and $s_n$ for all transmitted bursts. Typically, multiple bursts will have the same $l_n$ and $s_n$, but for some n, either $l_n \neq l_{n+1}$ or $s_n \neq s_{n+1}$ (or possibly both). These points will be denoted as adaptation points, and mark locations in the stream of transmitted bursts where either the number of encoded packets per burst or the burst channel coding scheme changes (or possibly both change). Typically, both the burst lengths, $l_n$, and the rates of the channel coding schemes, $s_n$ are non-increasing. This implies that as adaptation occurs, transmission rate decreases as overhead and redundancy increase.

In good channel conditions, suppose the probability of erasure for bursts coded with scheme $s_n$ is low (where erasure is caused by a CRC failure). As channel conditions degrade, bursts coded with scheme $s_n$ will be erased with increasing frequency until finally virtually all bursts are erased. At this point, only bursts coded with schemes $s_m$ and beyond (where $s_m \neq s_n$) will be received successfully. With properly chosen $i_n$, $l_n$, and $s_n$, message delivery times will increase gracefully as channel conditions degrade, yet fast delivery can be maintained in ideal conditions.

There are a number of advantages to this approach. Since $i_n$, $l_n$, and $s_n$ are known by both the transmitter and receiver a priori, no automatic-repeat-request (ARQ) mechanism is required for adaptation. Thus, one key desirable aspect of rateless codes is retained. Since multiple burst sizes and channel coding schemes are used, operation of the rateless code can be extended over a very wide range of channel conditions. Furthermore, this approach is well suited for small message lengths in systems where the cost of using a back channel is relatively high.

In one of many possible configurations that has been analyzed, 3 burst formats are used. These three formats make use of 3 different burst sizes and two different channel coding schemes: both a high-rate modulation scheme and a low-rate modulation scheme.

An initial first burst format uses a high rate modulation scheme with 12 bits per symbol. Four 18-bit encoded packets and a 24-bit CRC are combined to create a burst of 96 bits or 8 symbols (i.e., 96 bits/12 bit per symbol). Using the previous exemplary complete source data of 1152 bits and assuming no losses, within 16 bursts the complete source data can be received. Experiments have shown when communicating through channels with typical high rate voice codecs, without any losses, all 1152 bits can be transmitted in well under 4 seconds using this burst format.

A second burst format uses a low rate modulation scheme with 6 bits per symbol. Two 18-bit encoded packets and a 12-bit CRC are combined to create a burst of 48 bits or 8 (48/6) symbols. This burst format extends operation into channels with the lowest rate voice codecs and moderate channel error rates.

A third burst format also uses a low rate modulation scheme with 6 bits per symbol. One 18-bit encoded packet and a 12-bit CRC are combined to create a burst of 30 bits or 5 (30/6) symbols. This burst format extends operation into channels with very high channel error rates.

Experiments have shown that with an appropriate choice of adaptation points for these three burst formats, even in channels with a significant number of errors, the complete source data is decoded successfully in typically no more than 25 seconds of transmission. Therefore, under even very poor conditions, the above described method can still transmit data in less time than the approximately 29 seconds that a CTM-based design would require to transmit the same data in an error-free channel.

With respect to a specific implementation of the adaptable modulation scheme, for a given rate, each symbol is formed as a sum of k sinusoids out of a possible set of n sinusoids, thereby transmitting $$\left\lfloor \log_2 \binom{n}{k} \right\rfloor$$

bits of information. The tones corresponding to the n sinusoids are chosen to be orthogonal to each other. The receiver takes the Discrete Time Fourier Transform (DTFT) at each of the n frequencies and then sorts the resulting n bins by magnitude to identify the k frequencies that have the largest magnitudes. Because the sinusoids are orthogonal, each sinusoid produces energy in only one bin of the DTFT. Therefore, the probability that a particular set of k sinusoids were transmitted given the received symbol will be maximized by choosing the k largest peaks of the DTFT.

Multi-rate operation can be achieved with this modulation scheme by choosing n and k as adaptation controls. Advantageously, the receiver structure is fixed. The receiver will always evaluate the DTFT at a fixed number of frequencies, sort the results in terms of magnitude, and choose the k frequencies that give the highest magnitude as the frequencies of the tones that are most likely to have been transmitted.

A codebook can be created with $$\binom{n}{k}$$

entries of binary words of length n that have k ones. For example, if n=16 and k=5, then there are $$\binom{16}{5} = 4{,}396$$

possible ways of choosing 5 tones out of a set of 16. Each possible symbol has a one to one correspondence with a 16 bit binary word having exactly five ones. If this set of 4,396 words is limited to a subset of 4,096, for example, by taking the smallest 4096 binary words, then each of these binary words or symbols represents 12 bits of information. When the n DTFT bins are sorted and the k highest are selected, a search may be done in the codebook for the binary word that is closest to the word having 1's in the positions that correspond to the particular k tones decoded. This codebook search can be done through an efficient binary search, for example. The index of the entry in the codebook corresponding to the binary word that is closest then gives the $$\left\lfloor \log_2 \binom{n}{k} \right\rfloor$$

decoded bits at the output of the demodulator.

Experiments indicate that the above adaptive modulation scheme is effective at modulating binary data through typical voice codecs at high rates while still yielding sufficiently low bit error rates for useful application with rateless codes as previously described.

Figure 5:
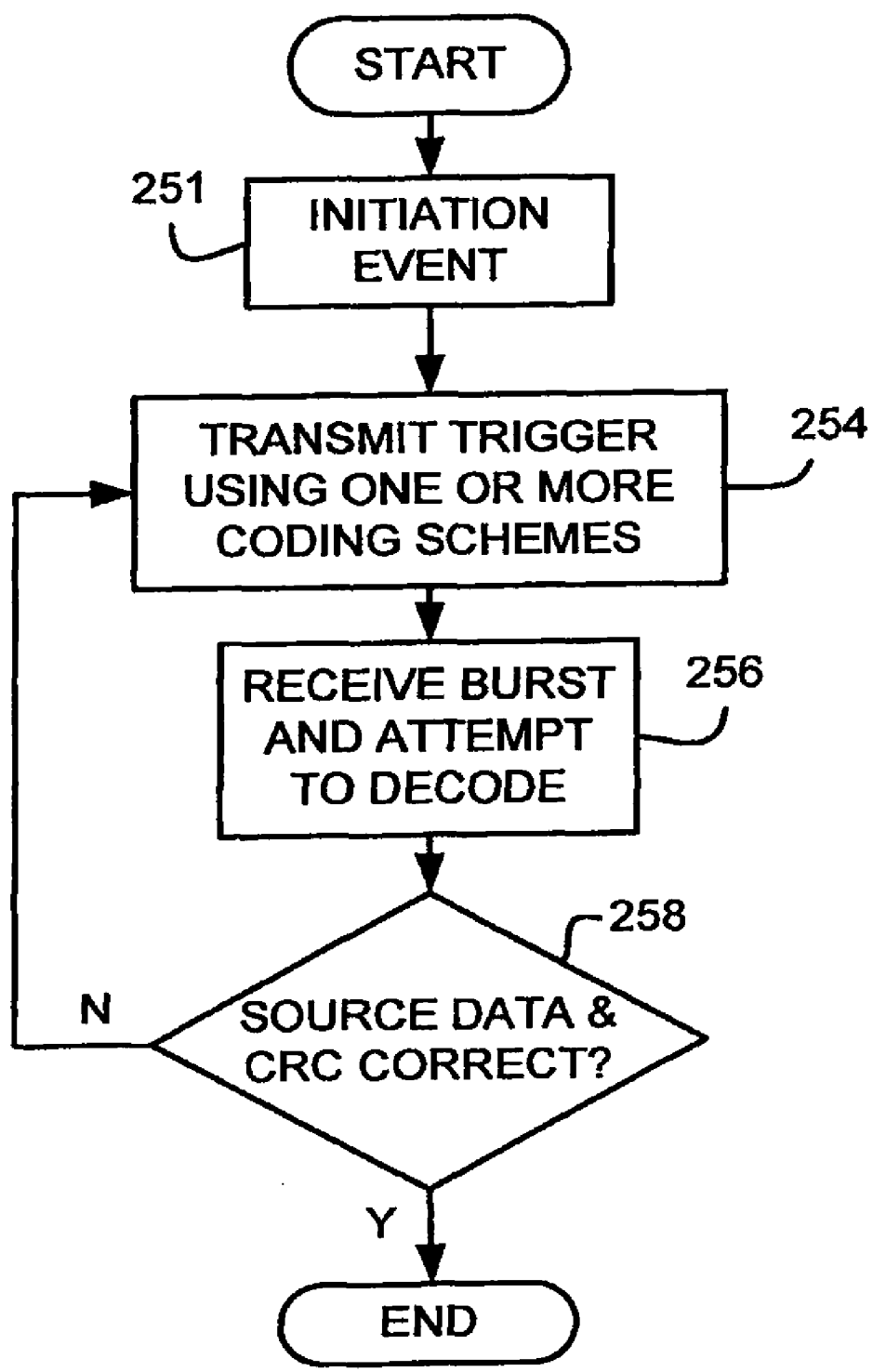
FIG. 5 is a flow chart setting forth the steps of a method of receiving and processing data using the communications system of FIG. 1.

Referring to FIG. 5 for an overview of the operation of the PSAP receiver. The receive process is initiated at process blocks 251 and 252 where the PSAP monitors for a communication or initiation signal indicating an initiation event from an IVS. Typically, the initiation event will be an incoming call from the IVS, but may include other triggering mechanisms, such as a manual request by an operator in an established call. At process block 254, after a communication has been initiated by an IVS, the PSAP begins transmission of a trigger signal to the IVS. As previously discussed, once the IVS successfully detects the PSAP trigger signal, the IVS begins transmitting bursts of one or more encoded packets. The PSAP receives the IVS bursts, extracts the packets, and attempts to decode the complete source data at process block 256. At block 258, if the source data is decoded successfully and the source data CRC is correct, the process terminates and no further trigger signals are transmitted by the PSAP. If the source data cannot be decoded or the CRC is incorrect, either an insufficient number of packets have been received or some packets have been received in error. In either case the trigger persists (see block 254) since more bursts are still required to decode the source data.

Figure 6:
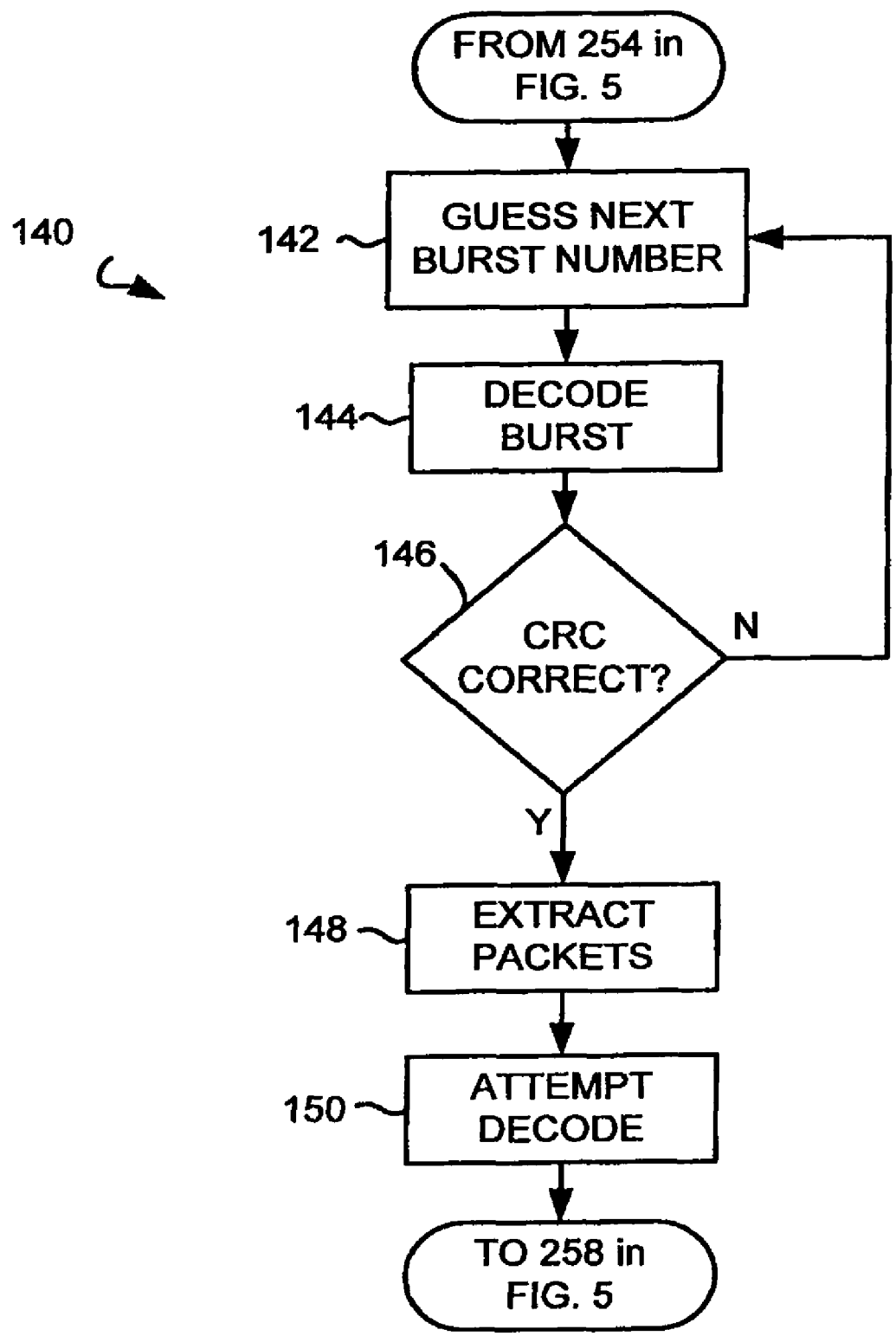
FIG. 6 is a flow chart setting forth the steps of a sub-process of the method illustrated in FIG. 5 for decoding bursts.

FIG. 6 illustrates a sub-process of the PSAP receiver in FIG. 5. At process block 142, the receiver attempts to guess, or blind detect, the burst number for the next incoming burst. One very simple algorithm involves iterating through successive possible burst numbers until the correct one is reached and the burst decodes successfully at process block 144, indicated by a correct CRC at process block 146. To this end, when a burst is received, the PSAP receiver distinguishes the encoded packet set from the associated received CRC included in the burst. Next the receiver combines a possible burst number with the encoded packet set to form a possible numbered packet set and calculates a calculated checksum or CRC for the possible numbered packet set. The receiver compares the calculated CRC and the received CRC. Where the calculated CRC is different than the received CRC, the receiver repeats the process above using a different possible burst number until the calculated and received CRCs match. Once the calculated CRC is identical to the received CRC, the receiver recognizing the possible burst number as the actual burst number.

When a correct CRC is found, the encoded packets are extracted from the burst at process block 148. The number of packets extracted is determined by the parameter $l_n$ (described earlier) for the burst number in question. The burst number is used to determine which packet numbers to assign to the received encoded packets, and therefore, which $G_n$ to use to update the decoding matrix D. At process block 150, a decoding attempt is made. If the decoding matrix can be inverted, the source data is recovered and can be verified against the source data CRC.

Referring back to FIG. 5, the PSAP trigger may be transmitted using multiple coding schemes. For example, the trigger may be formed from binary pseudo-random sequences encoded using one or more of the possible channel coding schemes that the IVS utilizes for transmission. This way, the PSAP can generate information that the IVS can use to assess channel conditions while sending the trigger signal. For instance, assuming an IVS uses two channel coding schemes: a high rate modulation scheme and a low rate modulation scheme (adapted to the channel conditions and/or speech codec mode), a binary pseudo-random sequence can be transmitted with each modulation scheme in an alternating fashion. For good channel conditions, it is likely that both the high and low rate sequences will be received equally well by the IVS as a received trigger signal. However, if, for example, the received trigger signal includes a sequence that is received seven times at the low modulation rate but only once at the high modulation rate, the IVS can be programmed to recognize that data throughput at the high rate is likely to be relatively low, assuming that uplink and downlink channel conditions are similar. In this case, the IVS may be programmed to transmit data to the PSAP using only the low modulation rate, as opposed to adapting through the usual pattern (e.g., starting with the high rate scheme followed by the low rate scheme only if the high rate scheme is unsuccessful). Thus, here, the initial modulation scheme is selected as a function of the trigger signals received from the PSAP.

In some embodiments it is contemplated that more than two channel coding schemes may be applied. In that case the trigger signal may be sequenced through each coding scheme and the IVS may be programmed to optimize transmission using any subset or all of the coding schemes.

Thus, the PSAP trigger in at least some configurations accomplishes two things. First, the trigger signal notifies the IVS when to start sending data. Here, the trigger is robust because of the choice of binary pseudo random sequence. Second, the trigger provides information that can be used by the IVS to determine which channel coding scheme is likely to be the most effective in terms of throughput when the IVS starts sending data to the PSAP.

Figure 7:
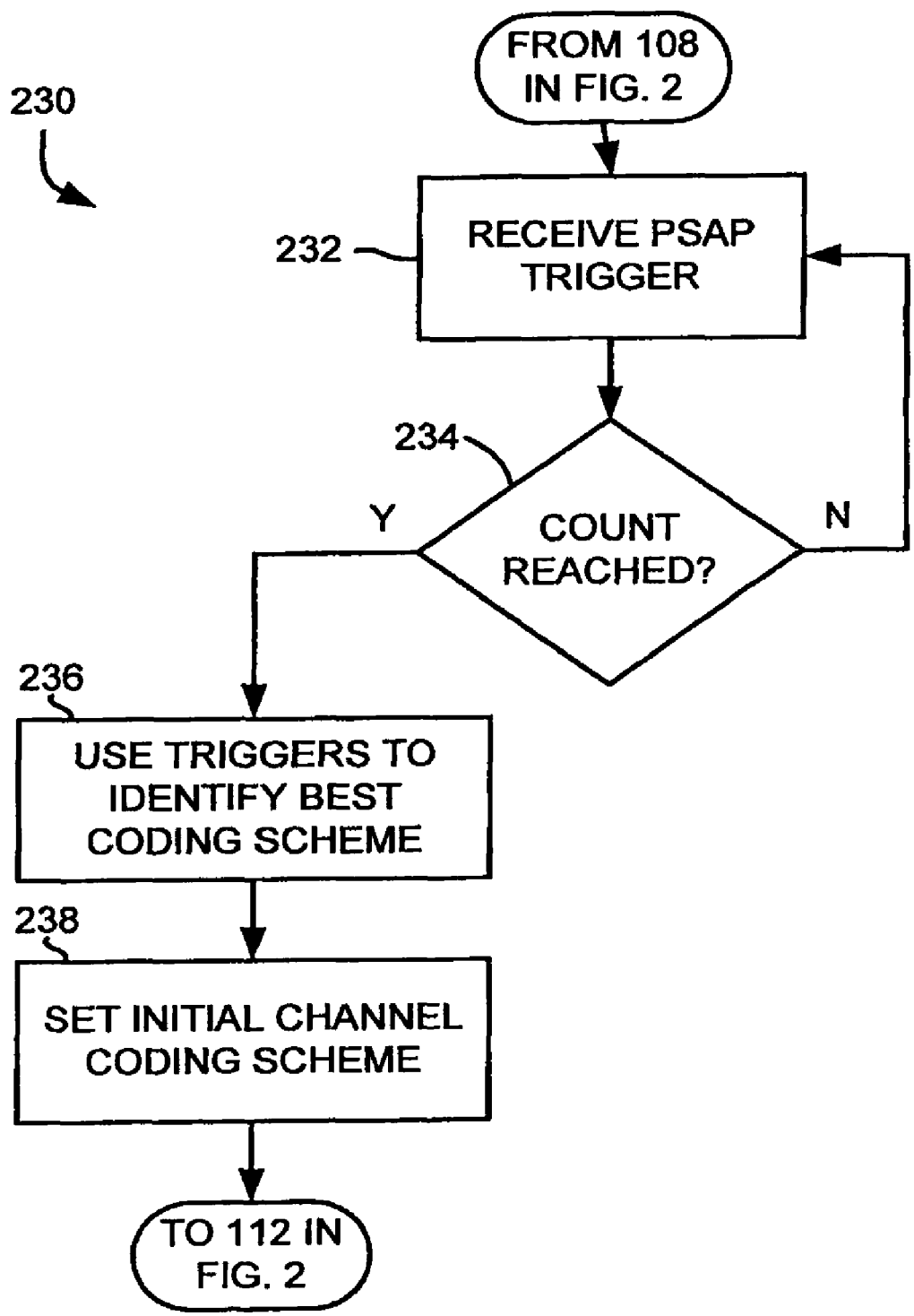
FIG. 7 is a flow chart setting forth the steps of a sub-process of the method illustrated in FIG. 2 for facilitating a trigger for a communications process using the system of FIG. 1.

Referring now to FIG. 7, a sub-process that may be substituted for a portion of the process shown in FIG. 2 is illustrated, whereby an IVS uses the PSAP triggers to identify the best channel coding scheme to use to transmit information to the PSAP. Referring also to FIG. 2, after packets have been encoded at process block 108, the IVS receives a trigger sequence from the PSAP at process block 232 in FIG. 7. In at least some embodiments the IVS may require that a certain minimum number of trigger signals or sequences are received before choosing the optimal coding scheme. This check is made at process block 234. If more trigger signals are required, the process repeats. Otherwise, at process block 236, the received trigger signals are used to determine which of the various coding schemes is optimal for transmission to the PSAP. This coding scheme is set in the IVS at process block 238 so that when process block 112 of FIG. 2 executes, bursts are transmitted using the appropriate coding scheme right from the start.

Choosing an optimal initial channel coding scheme does not eliminate the possibility of later adaptation. For example, if the IVS starts transmission at the highest possible rate based upon the PSAP trigger, it is still possible that the IVS will adapt through the available burst formats if the channel conditions differ from what was expected based upon the trigger.

In other embodiments it is contemplated that other sub-processes similar to the sub-process of FIG. 7 may be employed for identifying an optimal initial channel coding scheme. For instance, in some embodiments where an IVS uses two channel coding schemes including a high rate modulation scheme and a low rate modulation scheme, the PSAP may transmit a series of eight high rate trigger signals without interleaving the low rate signals and follow up the eight initial signals with a continual set of low rate signals. Here, based on the throughput of the eight high rate signals, the IVS may determine if the high or low rate should be used to transmit subsequent packets. Thus, for instance, where between six and eight high rate signals were received, the high rate modulation scheme may be used and where less than six high rate signals were received the low rate scheme may be employed. Other patterns of trigger signals are contemplated as well as other threshold levels for using the high rate as opposed to the low rate schemes.

The present disclosure has been described in terms of the various aspects and features, and it should be appreciated that many equivalents, alternatives, variations, and modifications, aside from those expressly stated, are possible and within the scope of the disclosure. Therefore, the disclosure should not be limited to a particular described embodiment.

We claim:

1. A mobile device for communicating wirelessly with a remote receiver station, the mobile device comprising:
    a controller configured to monitor a status of the mobile device and, upon an initiation event, initiate a data transfer process to wirelessly communicate data to the remote receiver station;
    a voice-band modem that, upon initiation of the data transfer process, is configured to communicate with the controller to:
        receive source data for transfer to the remote receiver station;
        encode the source data to form a series of encoded packets;
        transmit the encoded packets to the remote receiver station using a first modulation scheme; and
        unless an indication is provided that the series of packets has been received by the receiving station, automatically retransmit the encoded packets to the remote receiver station using a second modulation scheme,
    wherein the voice-band modem and controller are further configured to communicate to use a first burst format for the first modulation scheme and at least one of a second burst format and a third burst format for the second modulation scheme.

2. The mobile device of claim 1 wherein the first burst format uses 12 bits per symbol and the second and third burst format use 6 bits per symbol.

3. A mobile device for communicating wirelessly with a remote receiver station, the mobile device comprising:
    a controller configured to monitor a status of the mobile device and, upon an initiation event, initiate a data transfer process to wirelessly communicate data to the remote receiver station;
    a voice-band modem that, upon initiation of the data transfer process, is configured to communicate with the controller to:
        receive source data for transfer to the remote receiver station;
        encode the source data to form a series of encoded packets;
        transmit the encoded packets to the remote receiver station using a first modulation scheme; and
        unless an indication is provided that the series of packets has been received by the receiving station, automatically retransmit the encoded packets to the remote receiver station using a second modulation scheme,
    wherein for the first and second modulation scheme, each symbol is formed as a sum of k sinusoids out of a possible set of n sinusoids to transmit $$\left\lfloor \log_2 \binom{n}{k} \right\rfloor$$

bits of information.

4. The mobile device of claim 3 wherein the voice-band modem and controller are further configured to communicate to utilize orthogonal tones corresponding to the n sinusoids.

5. A mobile device for communicating wirelessly from a mobile device to a remote receiver station, the mobile device comprising:
    a controller configured to monitor a status of the mobile device and, upon an initiation event, initiate a data transfer process to wirelessly communicate data to the remote receiver station;
    a voice-band modem that, upon initiation of the data transfer process, is configured to communicate with the controller to:
        receive source data for transfer to the remote receiver station;
        encode the source data to form a series of encoded packets;
        transmit the encoded packets to the remote receiver station using a first modulation scheme; and unless an indication is provided that the series of packets has been received by the receiving station, automatically retransmit the encoded packets to the remote receiver station using a second modulation scheme, wherein the voice-band modem and controller are further configured to communicate to withhold transmission of the series of encoded packets until a trigger signal is received by the mobile device to indicate a readiness of the remote receiver station to receive the series of encoded packets from the mobile device.

6. The mobile device of claim 5 wherein the indication that the series of packets has been received by the receiving station is a discontinuation of receiving the trigger signal from the remote receiver station.

* * * * *